US008362540B2

(12) United States Patent
Ejury

(10) Patent No.: US 8,362,540 B2
(45) Date of Patent: Jan. 29, 2013

(54) INTEGRATED CIRCUIT PACKAGE WITH REDUCED PARASITIC LOOP INDUCTANCE

(75) Inventor: Jens Ejury, Fremont, CA (US)

(73) Assignee: Infineon Technologies AG, Neubiberg (DE)

( * ) Notice: Subject to any disclaimer, the term of this patent is extended or adjusted under 35 U.S.C. 154(b) by 308 days.

(21) Appl. No.: 12/887,928

(22) Filed: Sep. 22, 2010

(65) Prior Publication Data

US 2012/0068681 A1  Mar. 22, 2012

(51) Int. Cl.
H01L 27/108 (2006.01)
H01L 29/76 (2006.01)
H01L 29/94 (2006.01)
H01L 31/119 (2006.01)

(52) U.S. Cl. ........... 257/299; 257/393; 257/E51.007; 257/E29.001

(58) Field of Classification Search .......... 257/299, 257/300, 393, E51.003, E29.001; 438/133, 438/195, 241
See application file for complete search history.

(56) References Cited

U.S. PATENT DOCUMENTS 7,190,026 B2 * 3/2007 Lotfi et al. .......... 257/336
7,705,434 B2   4/2010 Otremba

FOREIGN PATENT DOCUMENTS

DE  3208021 A1  11/1982
DE  10103337 A1   1/2002
DE  10303435 A1  10/2004

* cited by examiner

Primary Examiner — Hoai V Pham
(74) Attorney, Agent, or Firm — Murphy, Bilak & Homiller, PLLC

(57) ABSTRACT

A multi-layer integrated circuit package includes a switched-mode power supply circuit including a plurality of transistors which form part of a main current loop of the switched-mode power supply circuit. The plurality of transistors are arranged in one or more layers of the integrated circuit package. The package further includes a conductive plate arranged in a different layer of the integrated circuit package than the plurality of transistors. The conductive plate is in close enough proximity to at least part of the main current loop so that a current can be electromagnetically induced in the conductive plate responsive to a change in current in the main current loop.

26 Claims, 4 Drawing Sheets

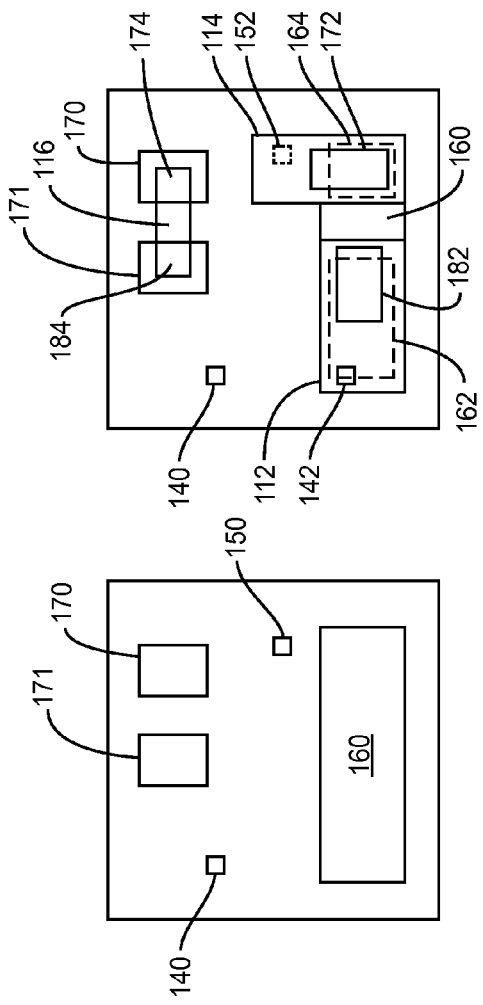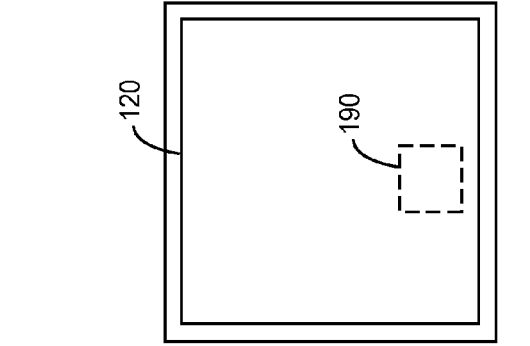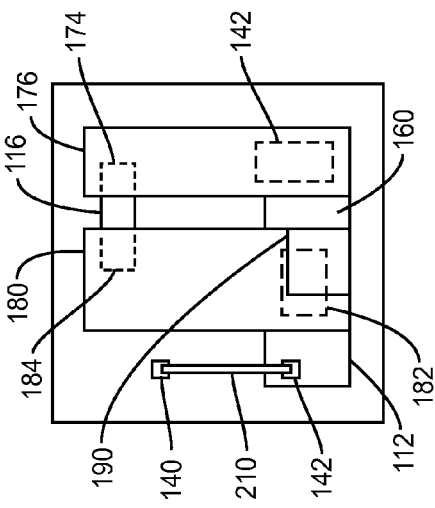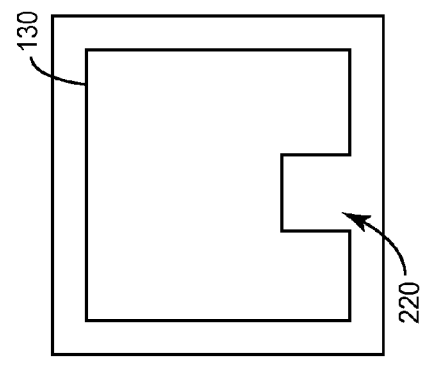

INTEGRATED CIRCUIT PACKAGE WITH REDUCED PARASITIC LOOP INDUCTANCE

BACKGROUND

Switched-mode power supply circuits such as synchronous buck converters provide power to a load through components such as capacitors, inductors, transformers, etc. and use switches that operate in an on or off state. Switched-mode power supply circuits dissipate very little power in either state and power conversion is accomplished with minimal power loss, thus yielding high efficiency. Switch-mode power supplies typically use semiconductor devices such as MOSFETs (Metal-Oxide-Semiconductor Field Effect Transistors). For example, a switched-mode power supply may include capacitors, an inductor, a MOSFET and a diode or alternatively a high-side MOSFET and a low-side MOSFET. Other component configurations are possible. In each case, components such as transistors, diodes and capacitors have associated parasitic elements that adversely affect the EMI (Electromagnetic Interference) or noise performance of the power supply circuit, thus limiting the switching frequency of the power supply.

For example, a switched-mode power supply circuit including a high-side MOSFET, low-side MOSFET and capacitor has a critical current loop that includes the drain-to-source current path of the high-side MOSFET, the drain-to-source current path of the low-side MOSFET and the capacitor current path from the drain of the high-side MOSFET to the source of the low-side MOSFET. The critical loop also includes the conductive traces or wires interconnecting the components. The parasitic inductance of the critical loop limits the switching frequency of the switched-mode power supply circuit. The parasitic loop inductance is a function of the loop area. Conventional switched-mode power supply circuits reduce the parasitic loop inductance by minimizing the area of the critical loop. Such solutions are highly dependent on the power supply package design and layout, and thus are effective for a particular type of package and layout. Redesign of the critical loop is needed each time the same switched-mode power supply circuit is included in a different type of package. Other conventional solutions involve a close arrangement of critical components. Further reduction in the parasitic loop inductance is desirable to increase the efficiency of switched-mode power supplies.

SUMMARY

According to an embodiment of an integrated circuit package, the package includes a switched-mode power supply circuit including a plurality of transistors and a capacitor coupled together to form a main current loop having a parasitic loop inductance. The integrated circuit package further includes a conductive plate spaced apart from the plurality of transistors and capacitor by one or more insulator layers of the integrated circuit package. The conductive plate is positioned within the integrated circuit package over at least a portion of the main current loop and is configured to reduce the parasitic loop inductance of the main current loop without carrying current flowing in the main current loop.

According to an embodiment of a method of operating an integrated circuit, the method includes providing an integrated circuit package with a switched-mode power supply circuit including a plurality of transistors and a capacitor coupled together to form a main current loop having a parasitic loop inductance, and a conductive plate spaced apart from the plurality of transistors and capacitor by one or more insulator layers and positioned over at least a portion of the main current loop. The method further includes reducing the parasitic loop inductance of the main current loop by electromagnetically inducing a current in the conductive plate of the integrated circuit package without the conductive plate carrying current flowing in the main current loop.

According to an embodiment of a multi-layer integrated circuit package, the package includes a switched-mode power supply circuit including a plurality of transistors which form part of a main current loop of the switched-mode power supply circuit. The plurality of transistors are arranged in one or more layers of the integrated circuit package. The package further includes a conductive plate arranged in a different layer of the integrated circuit package than the plurality of transistors. The conductive plate is in close enough proximity to at least part of the main current loop so that a current can be electromagnetically induced in the conductive plate responsive to a change in current in the main current loop.

According to an embodiment of a method of fabricating a multi-layer integrated circuit package, the method includes arranging a plurality of transistors of a switched-mode power supply circuit in one or more layers of the integrated circuit package to form part of a main current loop of the switched-mode power supply circuit. The method further includes arranging a conductive plate in a different layer of the integrated circuit package than the plurality of transistors and in close enough proximity to at least part of the main current loop so that a current can be electromagnetically induced in the conductive plate responsive to a change in current in the main current loop.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings:

FIGS. 4A-4E are top-down plan views of different layers of the integrated circuit package of FIG. 1 according to an embodiment.

DETAILED DESCRIPTION

Figure 1:
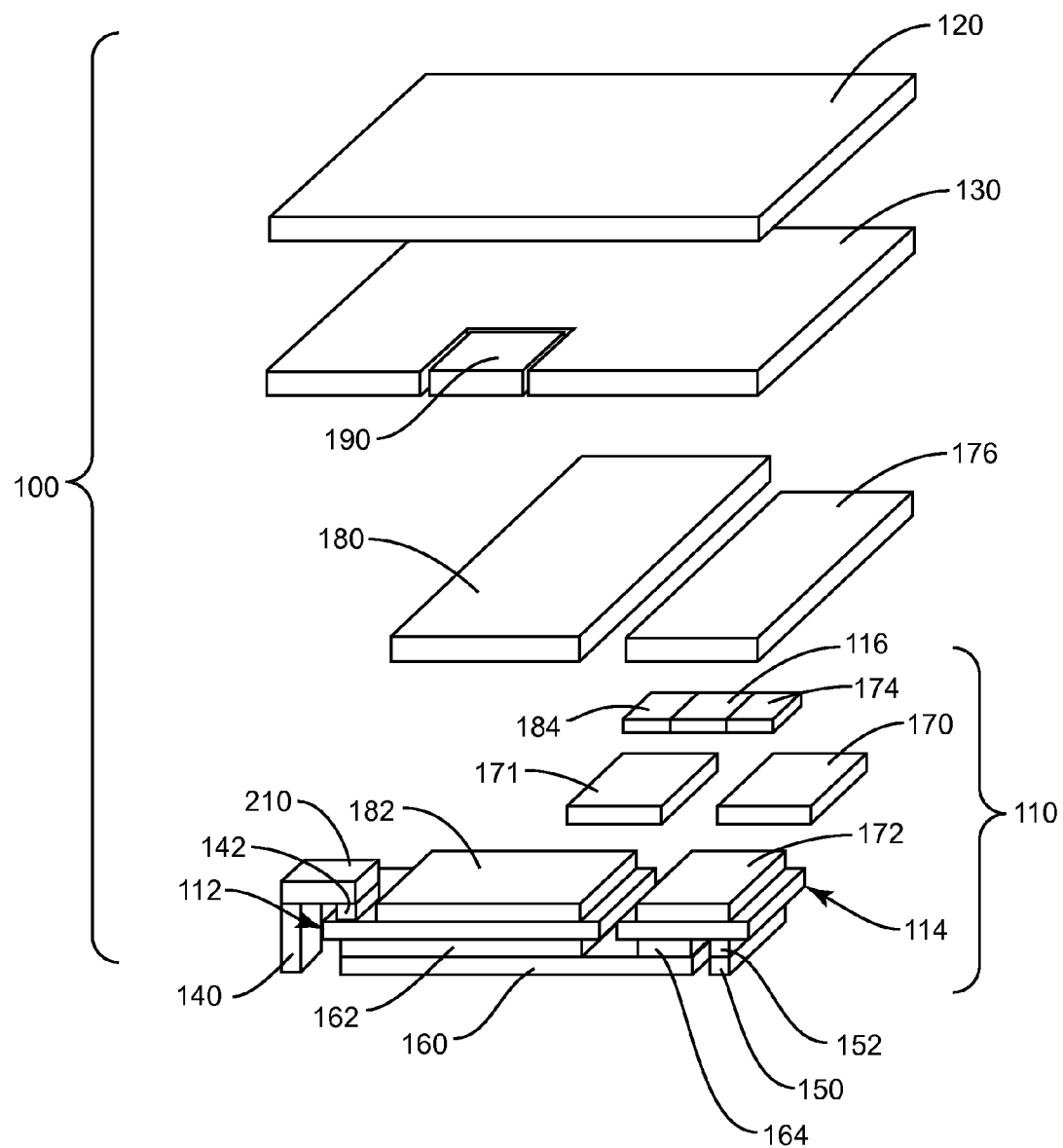
FIG. 1 is an exploded perspective view of an integrated circuit package including a switched-mode power supply circuit and a conductive plate according to an embodiment.

FIG. 1 illustrates an exploded perspective view of a multi-layer integrated circuit package 100 that includes a switched-mode power supply circuit 110 arranged in one or more layers of the package 100 and a conductive plate 120 arranged in a different layer of the package 100. The switched-mode power supply circuit 110 includes a plurality of active components 112, 114 such as transistors and/or diodes which form part of a main current loop of the switched-mode power supply circuit 110. The switched-mode power supply circuit 110 also includes a capacitor 116 which can be included in the package 100 as shown in FIG. 1 or positioned external to the package 100. In either case, the active components 112, 114 and capacitor 116 form a main current loop of the switched-mode power supply circuit 110 which has a parasitic loop inductance.

Figure 2:
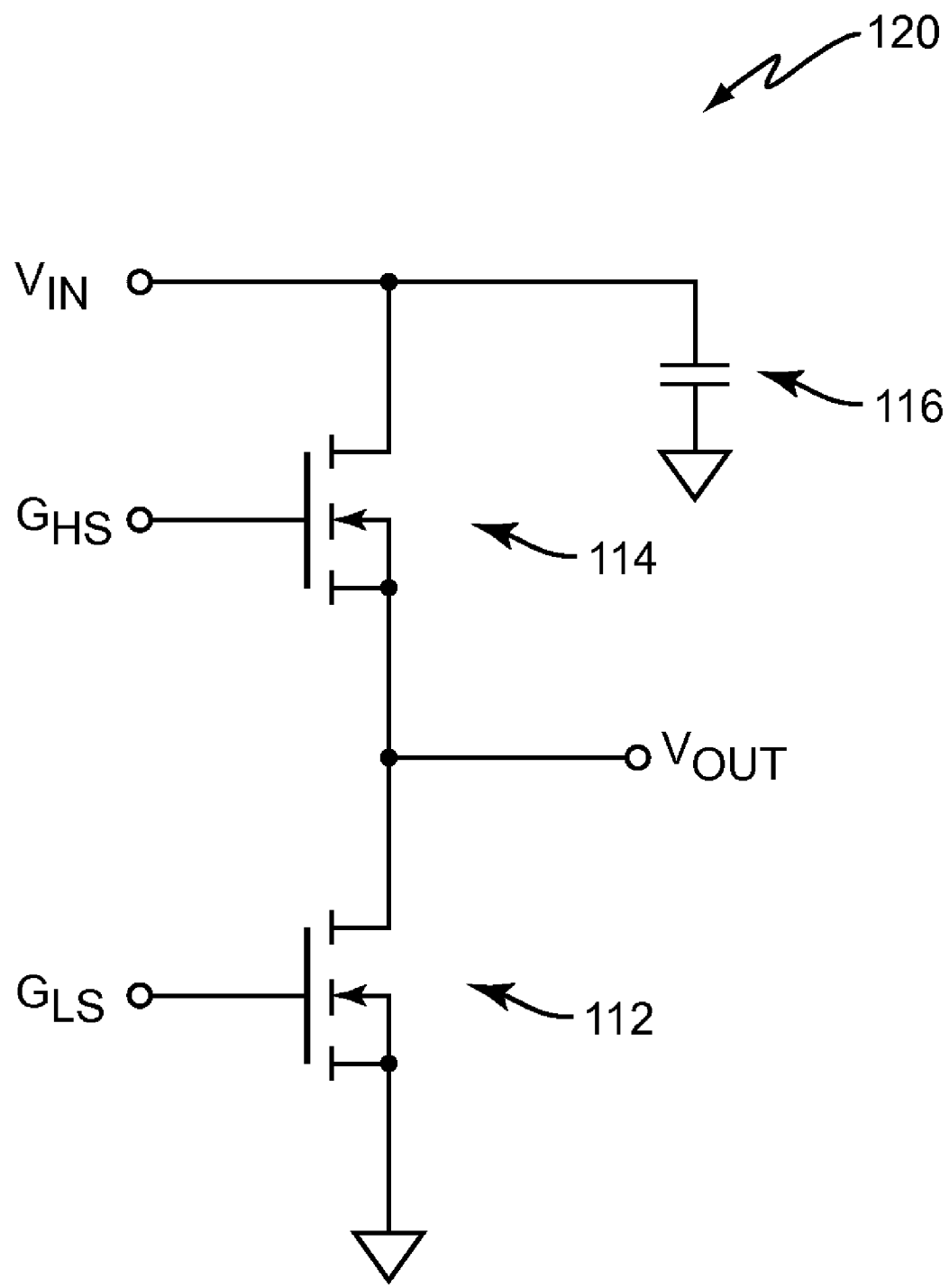
FIG. 2 is a circuit diagram of the switched-mode power supply circuit shown in FIG. 1.

FIG. 2 illustrates a circuit diagram of an embodiment of the switched-mode power supply circuit 110. According to this embodiment, the switched-mode power supply circuit 110 includes a low-side MOSFET 112, a high-side MOSFET 114 and a capacitor 116. For example, the switched-mode power supply circuit can be a synchronous buck converter, a boost converter, a buck-boost converter, etc. or any other type of switched-mode circuit. The conductive plate 120 is not shown in the circuit diagram of FIG. 2, but electromagnetically couples to the switched-mode power supply circuit 110 during transistor switching. In one embodiment, the low-side MOSFET 112, high-side MOSFET 114 and conductive plate 120 are integrated on the same semiconductor die. In another embodiment, the MOSFETs 112, 114 are provided separate from the conductive plate 120.

The switched-mode power supply circuit 110 has a voltage input terminal ($V_{IN}$) coupled to the drain of the high-side MOSFET 114 and one plate of the capacitor 116. The other plate of the capacitor 116 is coupled to a reference potential such as ground. The switched-mode power supply circuit 110 also has a first gate input ($G_{HS}$) coupled to the gate of the high-side MOSFET 114 and a second gate input ($G_{LS}$) coupled to the gate of the low-side MOSFET 112 for controlling the respective switching states of the MOSFETs. The source of the high-side MOSFET 114 is coupled to the drain of the low-side MOSFET 112 to form a voltage output terminal ($V_{OUT}$) of the switched-mode power supply circuit 110. The source of the low-side MOSFET 112 is grounded. The main current loop is formed by the drain-to-source current path of the high-side MOSFET 114, the drain-to-source current path of the low-side MOSFET 112 and the capacitor current path from the drain of the high-side MOSFET to the source of the low-side MOSFET.

High di/dt switching current occurs during switching transitions between the high-side MOSFET 114 and the low-side MOSFET 112 as sourced by the capacitor 116, e.g. a multilayer ceramic capacitor in some embodiments. The energy stored in the inductive loop formed by the drain-to-source current path of the high-side MOSFET 114, the drain-to-source current path of the low-side MOSFET 112 and the capacitor current path is lost if unutilized. This loss increases linearly with switching frequency and limits the switching frequency for a given constellation. A higher switching frequency can be realized by placing the conductive plate 120 of the package 100 in close proximity to at least some of the components that form the main current loop of the switched-mode power supply circuit 110, thereby decreasing the loop inductance.

The inductance of the main current loop decreases because of the magnetic field coupling between the switched-mode power supply circuit 110 and the conductive plate 120. That is, a high di/dt switching current in the switched-mode power supply circuit 110 generates a strong magnetic field which in turn induces a current in the conductive plate 120 which is disposed within the package 100 near the power supply circuit 110. The current induced in the conductive plate 120 in turn generates a second magnetic field which counteracts the magnetic field generated by the power supply circuit 110, at least partly canceling the magnetic field and reducing the parasitic loop inductance. The current induced in the conductive plate 120 corresponds to changes in the amount or direction of current flowing in the main current loop of the switched-mode power supply circuit 110, but the conductive plate does not carry current flowing in the main current loop. That is, the conductive plate 120 does not form part of the main current loop.

Returning to the integrated circuit package 100 shown in FIG. 1, the package 100 has multiple layers and the conductive plate 120 is arranged in one or more of the layers. The conductive plate 120 can be a single continuous plate. Alternatively, the conductive plate can have one or more openings. In general, the conductive plate 120 can have any suitable shape and size sufficient to electromagnetically couple the plate 120 to at least part of the main current loop of the switched-mode power supply circuit 110 so that current is induced in the plate 120 responsive to a change in current in the main current loop.

The conductive plate 120 is positioned over at least a portion of the low-side MOSFET 112 and at least a portion of the high-side MOSFET 114. The MOSFETs 112, 114 can be included in different semiconductor dies as shown in FIG. 1 or integrated in the same die. In one embodiment, an insulator 130 is interposed between the conductive plate 120 and the MOSFETs 112, 114. The conductive plate 120 can be designed to cover the capacitor 116 if the capacitor 116 is integrated within the package 100. The capacitor 116 is arranged in a different layer of the package 100 than the conductive plate 120 as shown in FIG. 1, and coupled to the plurality of transistors 112, 114 as shown in FIG. 2 to complete the main current loop of the switched-mode power supply circuit 110 as described above. Otherwise, the capacitor 116 is externally connected. In either case, the conductive plate 120 is included within the package 100 in close enough proximity to at least part of the main current loop so that a current can be electromagnetically induced in the conductive plate 120 responsive to a change in current in the main current loop as described above.

The integrated circuit package 100 also includes terminals for facilitating electrical connections to the switched-mode power supply circuit 110. In one embodiment, a first gate terminal 140 is coupled to a gate electrode 142 disposed on the top side of the low-side MOSFET 112. A second gate terminal 150 is coupled to a gate electrode 152 disposed on the bottom side of the high-side MOSFET 114. The gate terminals 140, 150 provide for coupling of gate control signals to the MOSFETs 112, 114, respectively. A voltage output terminal 160 is coupled to a drain electrode 162 disposed on the bottom side of the low-side MOSFET and to a source electrode 164 disposed on the bottom side of the high-side MOSFET 114. The package 100 also includes a voltage input terminal 170 and a ground terminal 171. A drain electrode 172 disposed on the top side of the high-side MOSFET 114 is coupled to one terminal 174 of the capacitor 116 via a voltage input plane 176 of the package 100. The bottom side of the capacitor terminal 174 is connected to the voltage input terminal 170. The bottom side of the other terminal 184 of the capacitor 116 is connected to the ground terminal 171 of the package 100. A reference plane 180 couples the top side of the second capacitor terminal 184 to a source electrode 182 disposed on the top side of the low-side MOSFET 112. The gate and source electrodes 152, 164 disposed on the bottom side of the high-side MOSFET 114 are insulated from one another to ensure proper operation of the MOSFET 114 and the gate and source electrodes 142, 182 disposed on the top side of the low-side MOSFET 112 are likewise insulated from one another. The reference plane 180 is interposed between the MOSFETs 112, 114 and the conductive plate 120 in a different layer of the integrated circuit package 100.

The integrated circuit package 100 can further include an interlayer conductive connector 190 that extends from one point at the bottom side of the conductive plate 120 to the reference plane 180 interposed between the conductive plate 120 and the transistors 112, 114. In one embodiment, the reference plane 180 is grounded as described above, and one plate of the capacitor 116 is connected to the grounded reference plane 180 as described above. The conductive plate 120 does not carry current flowing in the main loop of the switched-mode power supply circuit 110 even with one point connected to the reference plane 180. In other embodiments, no point of the conductive plate 120 is connected to the reference plane 180 and the conductive plate 120. The conductive plate 120 can be generally planar as shown in FIG. 1 or conform to the shape of the underlying layers of the package 100.

Figure 3:
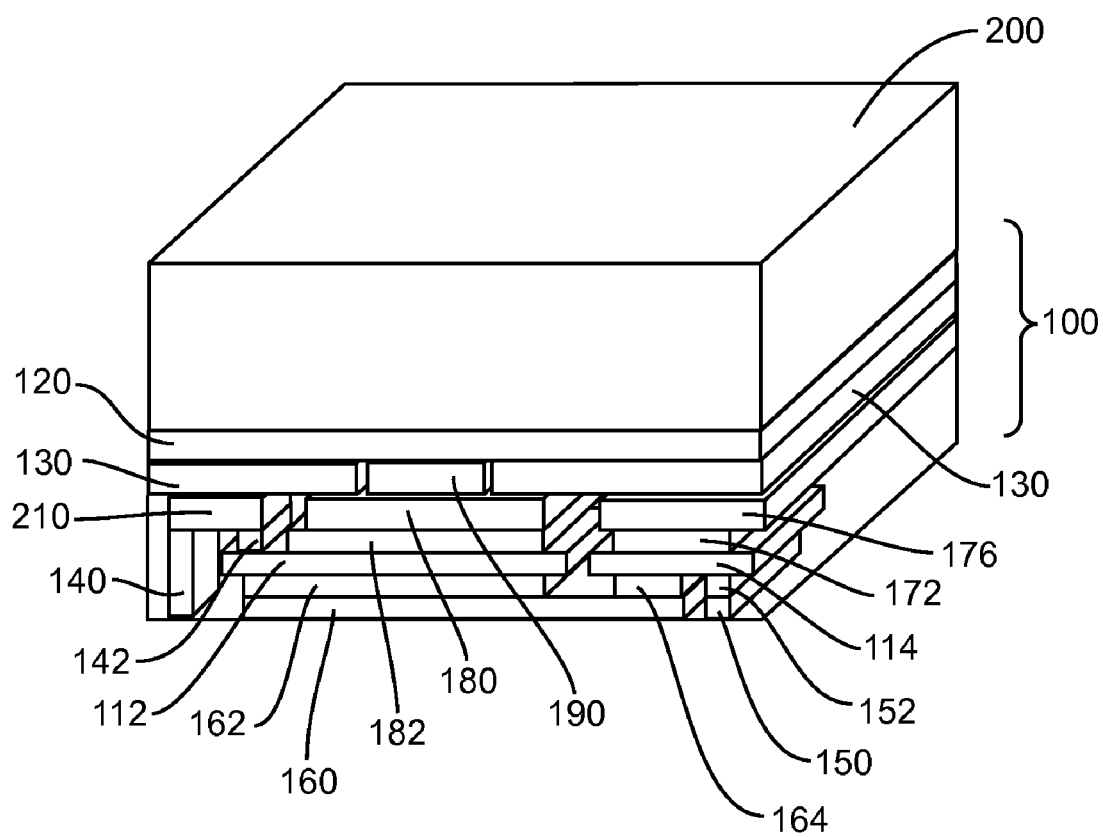
FIG. 3 is a perspective view of the integrated circuit package of FIG. 1 with a heat sink attached to the conductive plate according to an embodiment.

FIG. 3 illustrates the assembled integrated circuit package 100 with the switched-mode power supply circuit 110 in close enough proximity to the conductive plate 120 so that the conductive plate 120 electromagnetically couples to the switched-mode power supply circuit 110 during operation of the power supply. The top side of the conductive plate 120 which faces away from the underlying transistors 112, 114 of the switched-mode power supply circuit 110 is exposed according to one embodiment. A heat sink 200 can be attached to the exposed top side of the conductive plate 120 to improve the heat transfer characteristics of the package assembly.

FIGS. 4A-4E illustrate different layers of the integrated circuit package 100 during assembly. FIG. 4A shows a terminal layer of the package 100 with the gate terminal 140 for the low-side MOSFET 112, the gate terminal 150 for the high-side MOSFET 114, the output terminal 160, the voltage input terminal 170 and the ground terminal 171. FIG. 4B shows the components of the switched-mode power supply circuit 110 positioned in an intermediary component layer of the package 100. The capacitor 116 is provided in one region and the transistors 112, 114 in different regions. The bottom side of one capacitor terminal 174 is connected to the voltage input terminal 170 and the bottom side of the other capacitor terminal 184 is connected to the ground terminal 171. The high-side MOSFET 114 is disposed over the gate terminal 150 for the high-side MOSFET 114 with the corresponding gate electrode 152 disposed on the bottom side of the MOSFET 114 connected to the corresponding gate terminal 150 of the package 100. The source electrode 164 disposed on the bottom side of the high-side MOSFET 114 is spaced apart from the gate electrode 152 which is also disposed on the bottom side of the high-side MOSFET 114. The gate and source electrodes 152, 164 on the bottom side of the high-side MOSFET 114 are shown with dashed lines in FIG. 4B because they are out of view. The drain electrode 162 disposed on the bottom side of the low-side MOSFET 112 is likewise shown with dashed lines in FIG. 4B. The source electrode 164 of the high-side MOSFET 114 and the drain electrode 162 of the low-side MOSFET 112 are both connected to the output terminal 160 of the package 100. The drain electrode 172 of the high-side MOSFET 114 and the gate and source electrodes 142, 182 of the low-side MOSFET are disposed on the respective top sides of the transistors.

FIG. 4C shows an intermediary connection layer of the package 100 disposed above the component layer. The connection layer includes the voltage input plane 176 with one end coupled to the drain electrode 172 of the high-side MOSFET 114, which is shown with dashed lines in FIG. 4C because it is out of view, and the other end coupled to the high-side terminal 174 of the capacitor 116 which is also shown with dashed lines. The voltage input plane 176 couples an input voltage provided at the voltage input terminal 170 of the package 100 to the drain of the high-side MOSFET 114 and one plate of the capacitor 116. The reference plane 180 has one end coupled to the source electrode 182 of the low-side MOSFET 112, which is shown with dashed lines in FIG. 4C because it is out of view, and the other end coupled to the low-side terminal 184 of the capacitor 116 which is also shown with dashed lines. The reference plane 180 couples the source of the low-side MOSFET 112 and the other plate of the capacitor 116 to a reference potential such as ground provided at the ground terminal 170 of the package 100.

In one embodiment, the reference plane 180 is grounded via the interlayer conductive connector 190 which extends from the top side of the reference plane 180 to the bottom side of the conductive plate 120 included within the package 100. The reference plane 180 can be grounded or coupled to another reference potential. The conductive plate 120 does not carry current flowing in the main loop of the switched-mode power supply circuit 110 even with one point connected to the reference plane 180 via the interlayer connector 190. In other embodiments, no point of the conductive plate 120 is connected to a reference plane and the interlayer connector 190 is excluded from the package 100. In either case, the connection layer of the package 100 also includes a third conductive plane 210 connecting the gate electrode 142 of the low-side MOSFET 112 to the corresponding gate terminal 140 in the underlying terminal layer of the package 100.

FIG. 4D shows an intermediary isolation layer of the package 100 disposed above the connection layer. The isolation layer includes the insulator 130 for separating the underlying components of the switched-mode power supply circuit 110 from the overlying conductive plate 120. The insulator 130 can be a single continuous layer or segmented into separate insulators each having a thickness that depends on the thickness of the underlying layers. This way, each layer of the package 100 is relatively planar. Alternatively, one or more of the package layers are non-planar. In either case, a gap 220 is provided in the insulator 130 to permit the interlayer conductive connector 190 to extend from the top side of the reference plane 180 to the bottom side of the conductive plate 120 for coupling one point of the conductive plate 120 to a reference potential such as ground. Otherwise, no gap is needed in the insulator 130.

FIG. 4E shows the conductive plate layer of the package 100. This layer can be the top layer of the package 100 if the top side of the conductive plate 120 is to be attached to a heat sink e.g. as shown in FIG. 3. Otherwise, one or more additional layers can be disposed above the conductive plate 120. The dashed box shown in FIG. 4E represents the interlayer conductive connector 190 that extends from the bottom side of the conductive plate 120 to the top side of the reference plane 180 when one point of the conductive plate 120 is coupled to a reference potential such as ground. If such a connection is not desired, interlayer connector 190 is excluded from the package 100 and the conductive plate 120 is physically disconnected from the underlying switched-mode power supply circuit 110 by the isolation layer. For example, the interlayer connector 190 if the capacitor 116 is external to the package 100.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. An integrated circuit package, comprising:
    a switched-mode power supply circuit including a plurality of transistors and a capacitor coupled together to form a main current loop having a parasitic loop inductance; and
    a conductive plate spaced apart from the plurality of transistors and capacitor by one or more insulator layers of the integrated circuit package, the conductive plate positioned within the integrated circuit package over at least a portion of the main current loop, the conductive plate configured to reduce the parasitic loop inductance of the main current loop without carrying current flowing in the main current loop.

2. The integrated circuit package of claim 1, wherein the conductive plate is configured to generate a magnetic field responsive to a current induced in the conductive plate by a magnetic field generated based on changes in the current flowing in the main current loop.

3. The integrated circuit package of claim 1, wherein the switched-mode power supply circuit is a power converter circuit comprising a high-side MOSFET and a low-side MOSFET, and wherein the conductive plate is positioned over at least a portion of the high-side MOSFET and at least a portion of the low-side MOSFET.

4. The integrated circuit package of claim 3, wherein the high-side MOSFET and the low-side MOSFET are included in different semiconductor dies.

5. The integrated circuit package of claim 1, wherein the conductive plate is connected to a reference potential at one point.

6. The integrated circuit package of claim 5, wherein the reference potential is ground and one plate of the capacitor is coupled to the ground reference potential.

7. A method of operating an integrated circuit, comprising:
    providing an integrated circuit package with a switched-mode power supply circuit including a plurality of transistors and a capacitor coupled together to form a main current loop having a parasitic loop inductance, and a conductive plate spaced apart from the plurality of transistors and capacitor by one or more insulator layers and positioned over at least a portion of the main current loop; and
    reducing the parasitic loop inductance of the main current loop by electromagnetically inducing a current in the conductive plate of the integrated circuit package without the conductive plate carrying current flowing in the main current loop.

8. The method of claim 7, comprising:
    changing the current in the main current loop;
    inducing a current in the conductive plate responsive to a first magnetic field generated responsive to the current change in the main current loop; and
    generating a second magnetic field responsive to the current induced in the conductive plate that at least partly cancels the first magnetic field.

9. The method of claim 7, comprising connecting one point of the conductive plate to a reference potential.

10. The method of claim 9, comprising:
    connecting one point of the conductive plate to a ground potential; and
    connecting one plate of the capacitor to the ground potential.

11. A multi-layer integrated circuit package, comprising:
    a switched-mode power supply circuit including a plurality of transistors which form part of a main current loop of the switched-mode power supply circuit, the plurality of transistors arranged in one or more layers of the integrated circuit package; and
    a conductive plate arranged in a different layer of the integrated circuit package than the plurality of transistors in close enough proximity to at least part of the main current loop so that a current can be electromagnetically induced in the conductive plate responsive to a change in current in the main current loop.

12. The multi-layer integrated circuit package of claim 11, wherein the switched-mode power supply circuit includes a first MOSFET and a second MOSFET, the conductive plate is disposed above the first and second MOSFETs, and at least one insulator layer is interposed between the conductive plate and the first and second MOSFETs.

13. The multi-layer integrated circuit package of claim 12, wherein the conductive plate is positioned over at least a portion of the first MOSFET and at least a portion of the second MOSFET.

14. The multi-layer integrated circuit package of claim 12, wherein the first MOSFET is a high-side MOSFET of a power converter circuit and the second MOSFET is a low-side MOSFET of the power converter circuit.

15. The multi-layer integrated circuit package of claim 14, wherein the multi-layer integrated circuit package further comprises:
    a first gate terminal coupled to a gate electrode of the low-side MOSFET;
    a second gate terminal coupled to a gate electrode of the high-side MOSFET;
    an output terminal coupled to a drain electrode of the low-side MOSFET and a source electrode of the high-side MOSFET;
    an input terminal coupled to a drain electrode of the high-side MOSFET; and
    a ground plane coupled to a source electrode of the low-side MOSFET, the ground plane interposed between the MOSFETs and the conductive plate in a different layer of the multi-layer integrated circuit package.

16. The multi-layer integrated circuit package of claim 11, wherein the conductive plate is a single continuous conductive plate.

17. The multi-layer integrated circuit package of claim 11, further comprising a capacitor arranged in a different layer of the integrated circuit package than the conductive plate and coupled to the plurality of transistors to complete the main current loop.

18. The multi-layer integrated circuit package of claim 17, further comprising an interlayer conductive connector extending from a bottom side of the conductive plate to a reference plane arranged in one of the layers of the integrated circuit package interposed between the conductive plate and the plurality of transistors.

19. The multi-layer integrated circuit package of claim 18, wherein the reference plane is grounded and one plate of the capacitor is coupled to the reference plane.

20. The multi-layer integrated circuit package of claim 11, wherein the conductive plate is generally planar.

21. The multi-layer integrated circuit package of claim 11, further comprising a heat sink attached to a side of the conductive plate facing away from the plurality of transistors.

22. A method of fabricating a multi-layer integrated circuit package, comprising:
arranging a plurality of transistors of a switched-mode power supply circuit in one or more layers of the integrated circuit package to form part of a main current loop of the switched-mode power supply circuit; and
arranging a conductive plate in a different layer of the integrated circuit package than the plurality of transistors in close enough proximity to at least part of the main current loop so that a current can be electromagnetically induced in the conductive plate responsive to a change in current in the main current loop.

23. The method of claim 22, comprising positioning the conductive plate over at least a portion of a first MOSFET and at least a portion of a second MOSFET of the switched-mode power supply circuit.

24. The method of claim 22, further comprising:
arranging a capacitor in a different layer of the integrated circuit package than the conductive plate; and
coupling the capacitor to the plurality of transistors to complete the main current loop.

25. The method of claim 24, further comprising connecting one end of an interlayer conductive connector to a side of the conductive plate facing the plurality of transistors and an opposing end of the interlayer conductive connector to a reference plane arranged in one of the layers of the integrated circuit package interposed between the conductive plate and the plurality of transistors.

26. The method of claim 25, further comprising:
grounding the reference plane; and
connecting one plate of the capacitor to the reference plane.

* * * * *